United States Patent
Maruko et al.

(10) Patent No.: US 7,868,680 B2
(45) Date of Patent: Jan. 11, 2011

(54) SEMICONDUCTOR INPUT/OUTPUT CONTROL CIRCUIT

(75) Inventors: Akira Maruko, Osaka (JP); Junichi Kuchinishi, Nara (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/092,789

(22) PCT Filed: Jul. 10, 2007

(86) PCT No.: PCT/JP2007/063727

§ 371 (c)(1),
(2), (4) Date: Mar. 11, 2010

(87) PCT Pub. No.: WO2008/029554

PCT Pub. Date: Mar. 13, 2008

(65) Prior Publication Data

US 2010/0231277 A1    Sep. 16, 2010

(30) Foreign Application Priority Data

Sep. 6, 2006  (JP) .............................. 2006-241035

(51) Int. Cl.
  *G06F 1/04*  (2006.01)
(52) U.S. Cl. .................... 327/291; 327/165; 327/298
(58) Field of Classification Search ................. 327/141, 327/154, 165–166, 291–294, 298–299
See application file for complete search history.

(56) References Cited

U.S. PATENT DOCUMENTS

| | | | | |
|---|---|---|---|---|
| 6,756,827 | B2 * | 6/2004 | Konuk et al. | 327/116 |
| 2006/0188048 | A1 | 8/2006 | Suzuki et al. | |

FOREIGN PATENT DOCUMENTS

| | | |
|---|---|---|
| JP | 2-238709 | 9/1990 |
| JP | 4-321318 | 11/1992 |
| JP | 8-51350 | 2/1996 |
| JP | 8-79042 | 3/1996 |
| JP | 2000-36192 | 2/2000 |
| JP | 2004-13820 | 1/2004 |

* cited by examiner

*Primary Examiner*—An T Luu
(74) *Attorney, Agent, or Firm*—McDermott Will & Emery LLP

(57) ABSTRACT

In a synchronous semiconductor device (250), an input/output control circuit is formed of a clock input I/O (260), a clock control signal input I/O (270) and a signal change detection circuit (280). The clock input I/O (260) includes a first input buffer (264) having a large threshold, a second input buffer (266) having a small threshold and an input selector (268). The signal change detection circuit (280) controls the input selector (268) so that a first input from the first input buffer (264) is normally selected and a second input from the second input buffer (266) is temporarily selected only when the signal change detection circuit (280) detects that a logic level of a clock control signal (279) is changed from a non-activated level to an activated level.

11 Claims, 9 Drawing Sheets

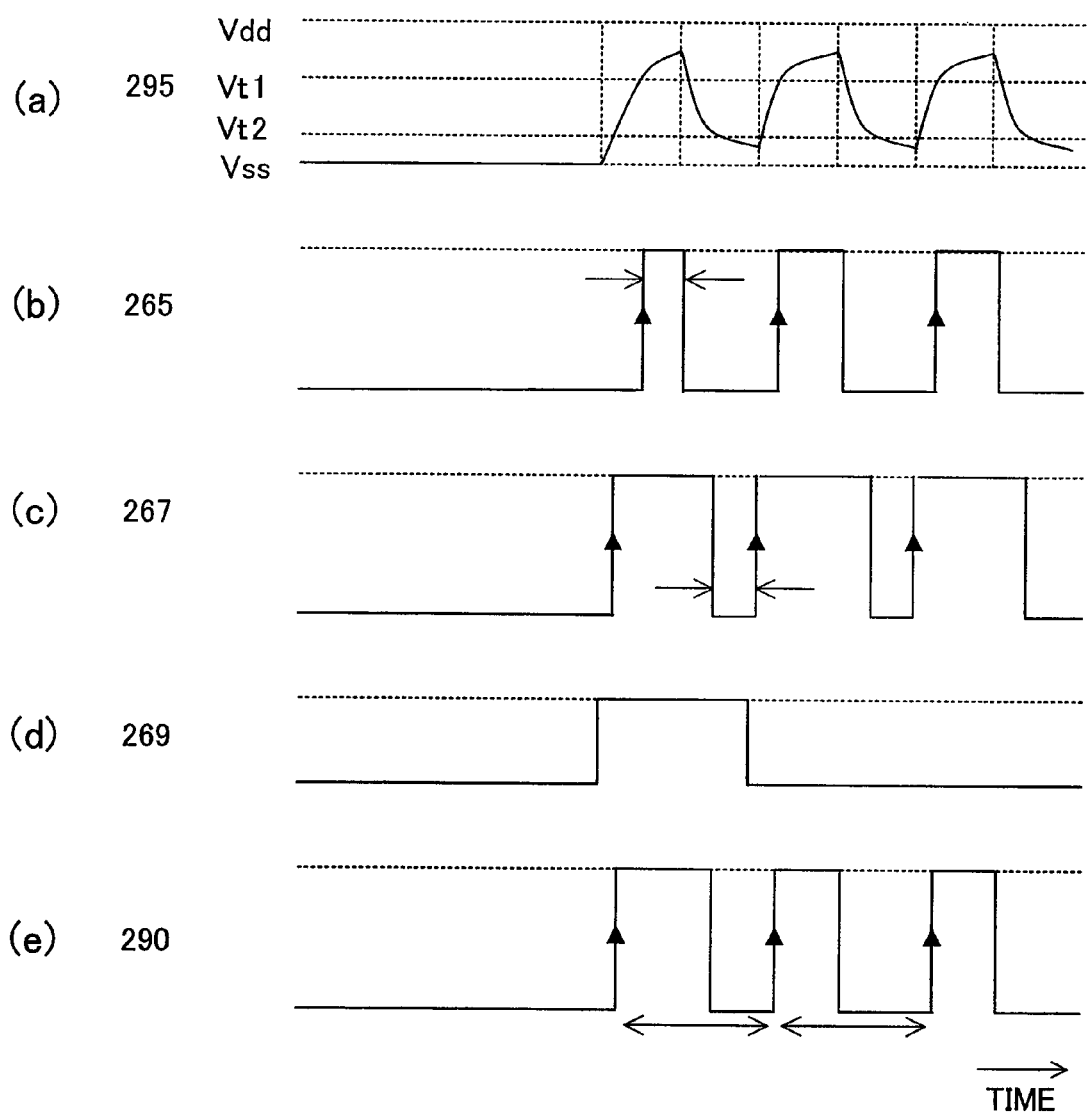

US 7,868,680 B2

SEMICONDUCTOR INPUT/OUTPUT CONTROL CIRCUIT

RELATED APPLICATIONS

This application is the U.S. National Phase under 35 U.S.C. §371 of International Application No. PCT/JP2007/063727, filed on Jul. 10, 2007, which in turn claims the benefit of Japanese Application No. 2006-241035, filed on Sep. 06, 2006, the disclosures of which Applications are incorporated by reference herein.

TECHNICAL FIELD

The present invention relates to an interface circuit between semiconductor devices, and more particularly relates to a semiconductor input/output control circuit for controlling signal input and output when one of the semiconductor devices is a synchronous semiconductor device for performing a synchronous operation with an external clock signal.

BACKGROUND ART

Conventionally, as a type of synchronous semiconductor devices, SDRAM (Synchronous Dynamic Random Access Memory) has been known. According to a known technique, an input buffer is so configured that a SDRAM receives a clock enable signal (i.e., a clock control signal) with a clock signal and inputs the clock signal only when the clock enable signal is activated, thus achieving reduction of power consumption (see Patent Reference 1).

There is also a known technique in which a gate voltage of an output switching device is boosted up using a delay circuit and a capacitor at start-up of an output circuit to temporarily enhance an output current of the output switching device (see Patent Reference 2).

Patent Reference 1: Japanese Laid-Open Publication No. 2000-36192
Patent Reference 2: Japanese Laid-Open Publication No. 2-238709

DISCLOSURE OF THE INVENTION

Problems that the Invention is to Solve

If a clock signal is steadily supplied while the clock enable signal is kept activated, a stable operation of the synchronous semiconductor device can be realized. In general, a clock signal to be supplied is stable in a state where a waveform distortion is generated by impedance due to a load capacitance between semiconductor devices. However, when high speed exchange of a clock signal is steadily performed, EMI (Electro Magnetic Interference) might be a problem due to the steady existence of frequency components of the clock signal. There is also another problem in which power is unnecessarily consumed in an I/O portion of each semiconductor device.

As a solution to this problem, output of a clock signal only in a necessary time period, i.e., intermittent output of a clock signal can be performed. However, in such a case, since impedance related to connection between semiconductor devices is relatively large, compared to the inside of respective semiconductor devices, problems such as a timing shift of a clock signal and insufficient signal drive arise because of an unstable transient operation at a start of supply of the clock signal. In the case where a current ability increasing mechanism such as the boost up circuit or the like is added in order to solve the instability problems, ameliorating effects on problems (EMI, spike and the like) due to high frequency components of a signal waveform and problems in power consumption are reduced.

Solution to the Problems

To solve the above-described problems, according to the present invention, in at least one of two semiconductor devices for exchanging a clock control signal with a clock signal, means for correcting a transient signal waveform of the clock signal immediately after a start of supply of the clock signal of which timing is indicated by the clock control signal is provided.

EFFECTS OF THE INVENTION

According to the present invention, signal waveform correction can be performed only to an unstable clock signal in a transient state without influencing a stable clock signal in a steady state.

BRIEF DESCRIPTION OF THE DRAWINGS

FIGS. 11(a) through 11(e) show examples of signal waveforms in the system of FIG. 10.

Figure 1:
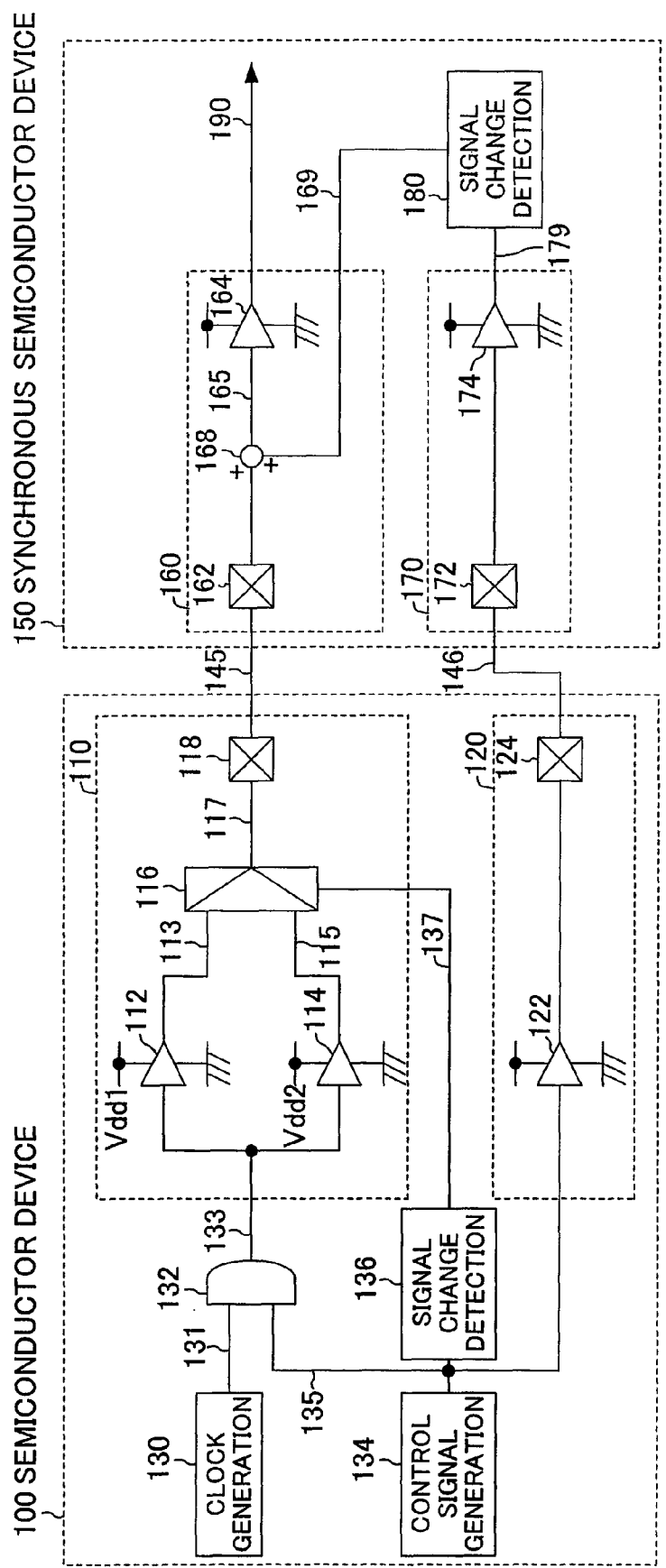
FIG. 1 is a block diagram illustrating a system using a semiconductor input/output control circuit according to a first embodiment of the present invention.

EXPLANATION OF REFERENCE NUMERALS 100, 200, 298 Semiconductor device
110, 210 Clock output I/O
112 First output buffer
114 Second output buffer
116 Output selector
120, 220 Clock control signal output I/O
122, 222 Control signal output buffer
130, 230 Clock generation circuit
132, 232 Clock mask circuit 134, 234 Control signal generation circuit
136, 236 Signal change detection circuit
140 Signal adding circuit
143 Output buffer
150, 240, 250 Synchronous semiconductor device
160, 260 Clock input I/O
164 Clock input buffer
168 Signal adding circuit
170, 270 Clock control signal input I/O
174, 274 Control signal input buffer
180, 280 Signal change detection circuit
212 Output buffer
214 Output adding buffer
238 Output adding clock mask circuit
264 First input buffer
266 Second input buffer
268 Input selector
300, 302 Flip-flop
304 Logic operational circuit
306 Buffer
400, 404 Resistance element
401, 403 Capacitance element

BEST MODE FOR CARRYING OUT THE INVENTION

Hereafter, embodiments of the present invention will be described with reference to the accompanying drawings.

First Embodiment

FIG. 1 is a block diagram illustrating a system using a semiconductor input/output control circuit according to a first embodiment of the present invention. As shown in FIG. 1, a semiconductor device 100 of this embodiment supplies an external clock control signal 146 with an external clock signal 145 to a synchronous semiconductor device 150.

The semiconductor device 100 includes: a clock generation circuit 130 for generating a basic clock signal 131; a control signal generation circuit 134 for generating a clock control signal 135; a clock masking circuit 132 for masking the basic clock signal 131 using the clock control signal 135; a signal change detection circuit 136 for detecting change of the clock control signal 135 from a non-activated (for example, "L") level to an activated (for example, "H") level; a clock output I/O 110 for receiving a masked clock signal 133 and outputting the external clock signal 145; and a clock control signal output I/O 120 for receiving the clock control signal 135 and outputting the external clock control signal 146.

The clock output I/O 110 includes: a first output buffer 112 for supplying a first output 113 driven by a first reference voltage Vdd1, based on the masked clock signal 133; a second output buffer 114 for supplying a second output 115 driven by a second reference voltage Vdd2 (>Vdd1), based on the masked clock signal 133; an output selector 116 for selecting one of the first output 113 of the first output buffer 112 and the second output 115 of the second output buffer 114, based on an output buffer selection signal 137 from the signal change detection circuit 136; and an I/O pad 118 for outputting, as the external clock signal 145, a selected output signal 117 of the output selector 116. The signal change detection circuit 136 supplies the output buffer selection signal 137 so that the output selector 116 normally selects the first output 113 and temporarily selects the second output 115 only when the signal change detection circuit 136 detects that the logic level of the clock control signal 135 is changed form the "L" level to the "H" level.

The clock control signal output I/O 120 includes a control signal output buffer 122 and an I/O pad 124, which are provided for outputting the external clock control signal 146, based on the clock control signal 135.

The synchronous semiconductor device 150 includes: a clock input I/O 160 for receiving the external clock signal 145 from the semiconductor device 100 and supplying an internal clock signal 190; a clock control signal input I/O 170 for receiving the external clock control signal 146 from the semiconductor device 100 and supplying a clock control signal 179; and a signal change detection circuit 180 for outputting a pulsed adding signal 169 when the signal change detection circuit 180 detects that a logic level of the clock control signal 179 is changed from the "L" level to the "H" level.

The clock input I/O 160 includes: an I/O pad 162 for receiving the external clock signal 145; a signal adding circuit 168 for adding the pulsed adding signal 169 to the external clock signal 145; and a clock input buffer 164 for driving the internal clock signal 190, based on a corrected clock input 165 from the signal adding circuit 168.

The clock control signal input I/O 170 includes an I/O pad 172 for receiving the external clock control signal 146 and a control signal input buffer 174 for driving the clock control signal 179, based on the external clock control signal 146.

Figure 2:
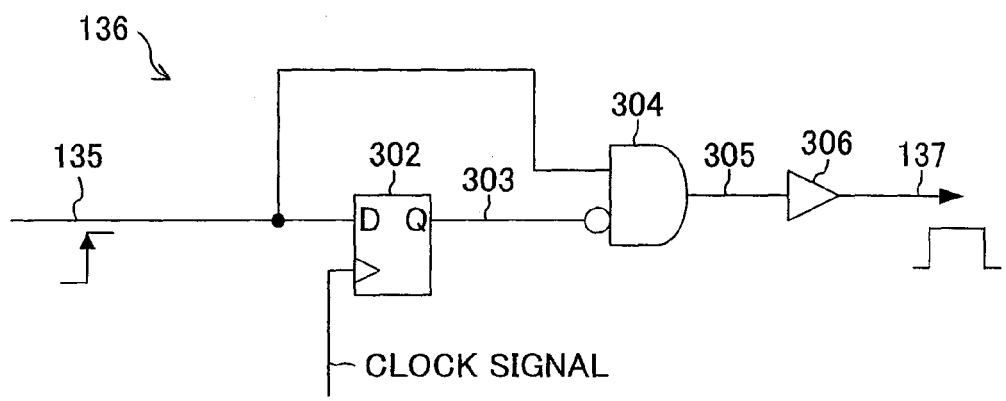
FIG. 2 is a circuit diagram illustrating an example of the signal change detection circuit in a semiconductor device provided in the clock signal output side in FIG. 1.

FIG. 2 is a circuit diagram illustrating an example of the signal change detection circuit 136 in the semiconductor device 100 provided in the clock signal output side in FIG. 1. The signal change detection circuit 136 of FIG. 2 is a synchronous circuit including a single flipflop 302, a logic operational circuit 304 and a buffer 306. The flipflop 302 holds the clock control signal 135 being delayed by 1 clock cycle, and only when the clock control signal 135 is "H" and a holding value 303 of the flipflop 302 is "L", an operation result 305 by the logic operational circuit 304 is "H". According to the operation result 305, an output buffer selection signal 137 is driven by the buffer 306. That is, the output buffer selection signal 137 is a signal holding the "H" level for 1 clock cycle determined by a clock signal supplied to the flipflop 302 from a time when the clock control signal 135 is changed from the "L" level to the "H" level.

Figure 3:
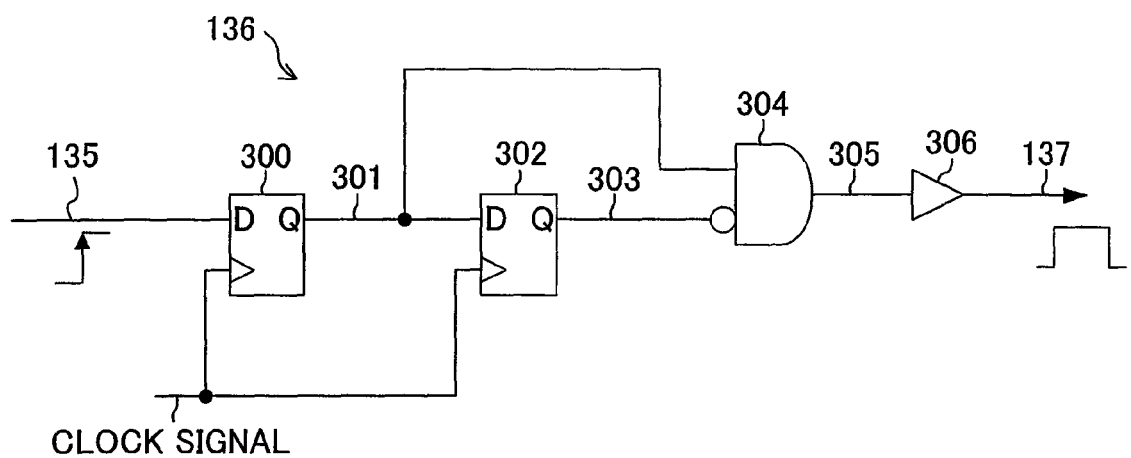
FIG. 3 is a circuit diagram illustrating another example of the signal change detection circuit in a semiconductor device provided in the clock signal output side in FIG. 1.

FIG. 3 is a circuit diagram illustrating another example of the signal change detection circuit 136. The signal change detection circuit 136 of FIG. 3 is a synchronous circuit including two flipflops 300 and 302, the logic operational circuit 304 and the buffer 306. For the clock control signal 135, states according to different clock cycles are held by the flipflop 300 in a previous stage and the flipflop 302 in a subsequent stage. Only when a holding value 301 of the flipflop 300 in the previous stage is "H" and the holding value 303 of the flipflop 302 in the subsequent stage is "L", the operation result 305 is "H". According to the operation result 305, the output buffer selection signal 137 is driven by the buffer 306. That is, with the configuration of FIG. 3, the output buffer selection signal 137 with delayed timing, compared to the configuration of FIG. 2, can be obtained.

Figure 4:
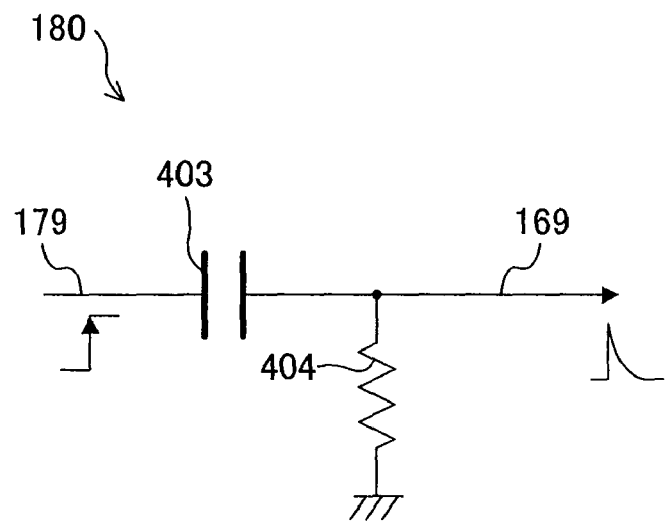
FIG. 4 is a circuit diagram illustrating an example of the signal change detection circuit in a synchronous semiconductor device in FIG. 1.

FIG. 4 is a circuit diagram illustrating an example of the signal change detection circuit 180 in the synchronous semiconductor device 150 of FIG. 1. The signal change detection circuit 180 of FIG. 4 is a non-synchronous non-linear circuit including a single capacitance element 403 and a single resistance element 404. With the configuration of FIG. 4, when the clock control signal 179 is changed from the "L" level to the "H" level, the pulsed adding signal 169 is obtained due to differentiation by the elements 403 and 404.

Figure 5:
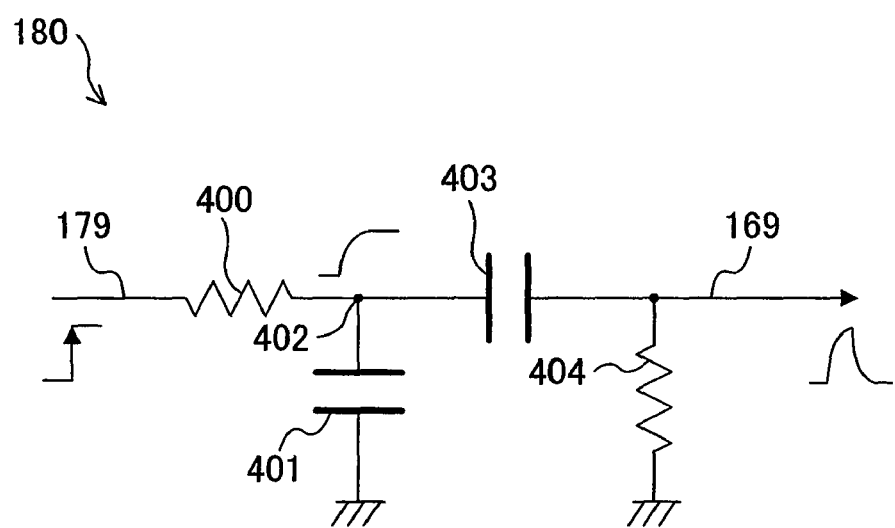
FIG. 5 is a circuit diagram illustrating another example of the signal change detection circuit in a synchronous semiconductor device of FIG. 1.

FIG. 5 is a circuit diagram illustrating another example of the signal change detection circuit 180. The signal change detection circuit 180 of FIG. 5 is a non-synchronous and non-linear circuit using two capacitance elements 401 and 403 and two resistance elements 400 and 404. An integration circuit 400 and 401 is provided in a previous stage of the differential circuit 403 and 404 of FIG. 4. With the configuration of FIG. 5, a waveform at an intermediate node 402 is moderate, compared to a rising waveform of the clock control signal 179 and, as a result, the adding signal 169 having a more moderate pulse shape than that in FIG. 4 can be obtained.

FIGS. 6(a) through 6(i) show examples of signal waveforms in the system of FIG. 1. In this case, the signal change detection circuit 136 of FIG. 2 and the signal change detection circuit 180 of FIG. 5 are adopted for the semiconductor device 100 and the synchronous semiconductor device 150, respectively.

Figure 6:
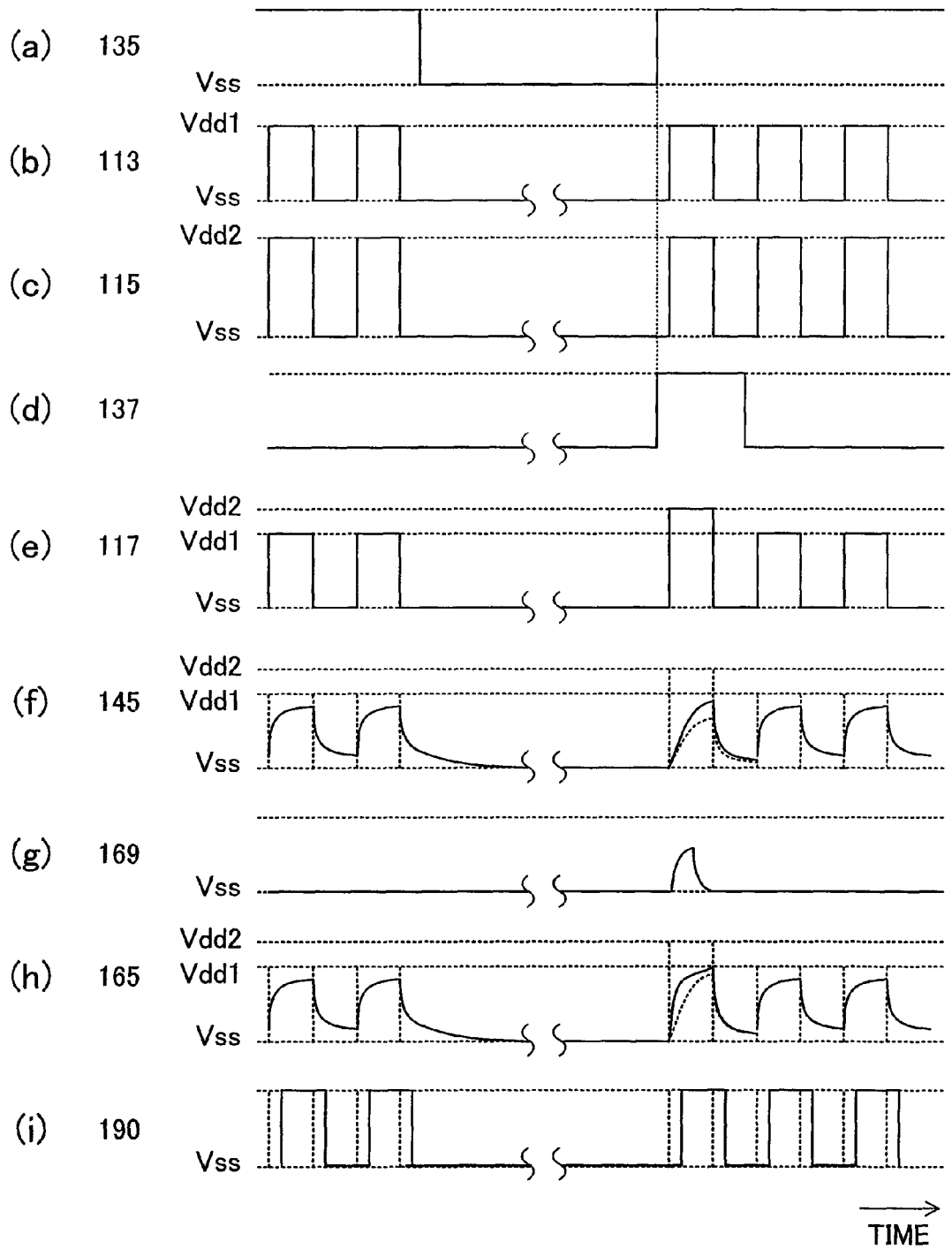
FIGS. 6(a) through 6(i) show examples of signal waveforms in the system of FIG. 1.

When the clock control signal 135 of FIG. 6(a) is generated, the first output 113 of the first output buffer 112 has a waveform of FIG. 6(b) and the second output 115 of the second output buffer 114 has a waveform of FIG. 6(c). Then, the output buffer selection signal 137 has a waveform of FIG. 6(d) and the selected output signal 117 from the output selector 116 has a waveform of FIG. 6(e). Thus, a waveform of the external clock signal 145 is improved to be a waveform of FIG. 6(f) immediately after supply of the external clock signal 145 is restarted, even if a waveform distortion is generated due to an external load.

In the synchronous semiconductor device 150, the pulsed adding signal 169 of FIG. 6(g) is generated and, as a result, the corrected clock input 165 has a corrected waveform of FIG. 6(h). Thus, the internal clock signal 190 can be made to be in an ideal state as shown in FIG. 6(i).

Note that the configuration of the semiconductor device 100 of FIG. 1 also exhibits the waveform improving effect in the case of cooperative processing with a semiconductor device having a different configuration from the configuration of FIG. 1. In the same manner, the configuration of the synchronous semiconductor device 150 of FIG. 1 exhibits the waveform improving effect even in the case of cooperative operation with a semiconductor device having a different configuration from the configuration of FIG. 1.

Figure 7:
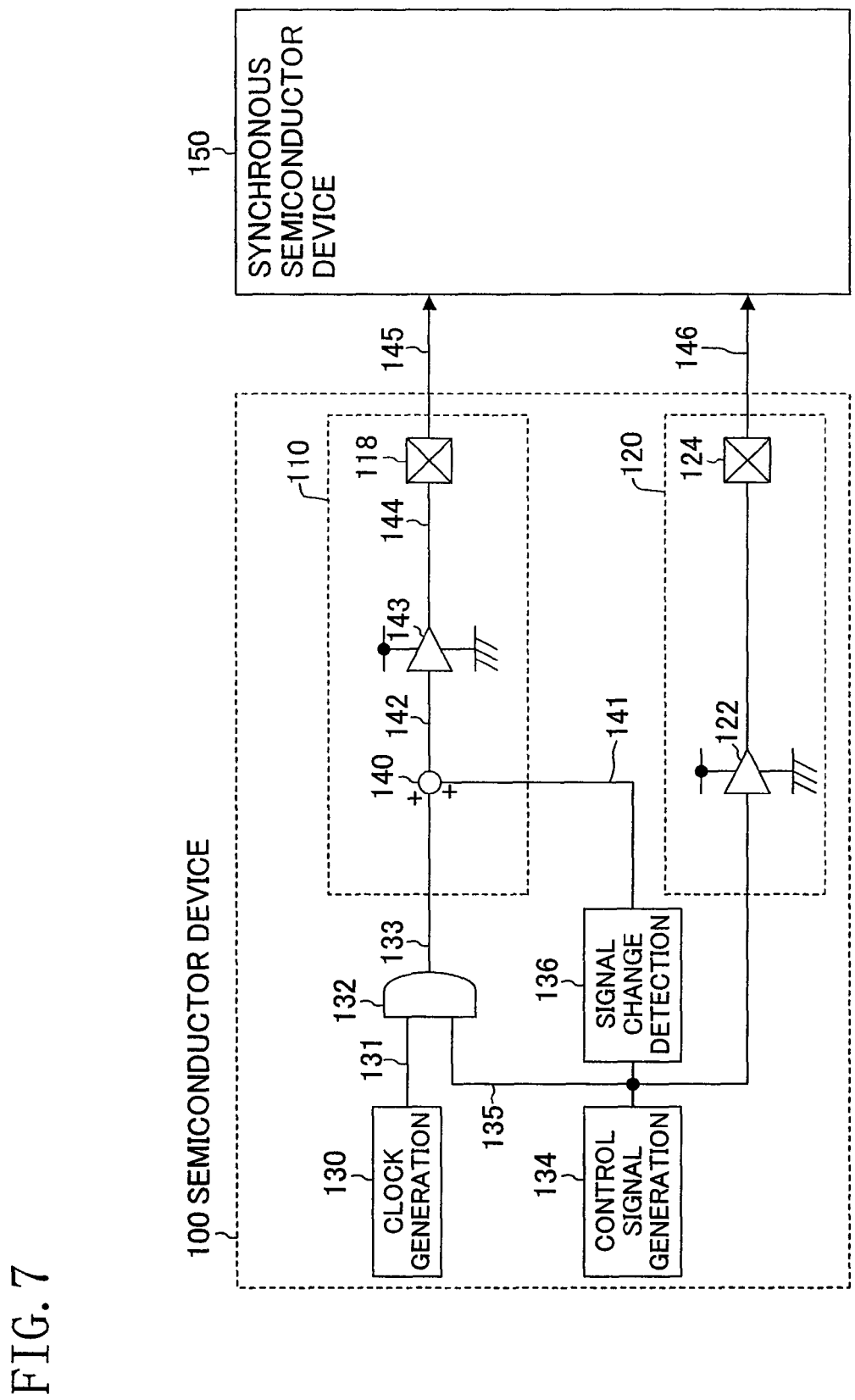
FIG. 7 is a block diagram illustrating a modified example of the semiconductor device provided in the clock signal output side in FIG. 1.

Moreover, the adding operation achieved using the signal adding circuit 168 in the synchronous semiconductor device 150 in FIG. 1 can be achieved in the semiconductor device 100 provided in the clock signal output side, which is shown in FIG. 7.

FIG. 7 is a block diagram illustrating a modified example of the semiconductor device 100 of FIG. 1. For example, the signal change detection circuit 136 of FIG. 7 has the same internal configuration as the configuration of FIG. 4 or FIG. 5 so that when detecting that the logic level of the clock control signal 135 is changed from the "L" level to the "H" level, the signal change detection circuit 136 outputs a pulsed adding signal 141. The clock output I/O 110 includes: a signal adding circuit 140 for adding the pulsed adding signal 141 to the masked clock signal 133; a clock output buffer 143 for driving an output clock signal 144, based on a corrected clock signal 142 which is an output of the signal adding circuit 140; and an I/O pad 118 for outputting the output clock signal 144 as an external clock signal 145.

Second Embodiment

Figure 8:
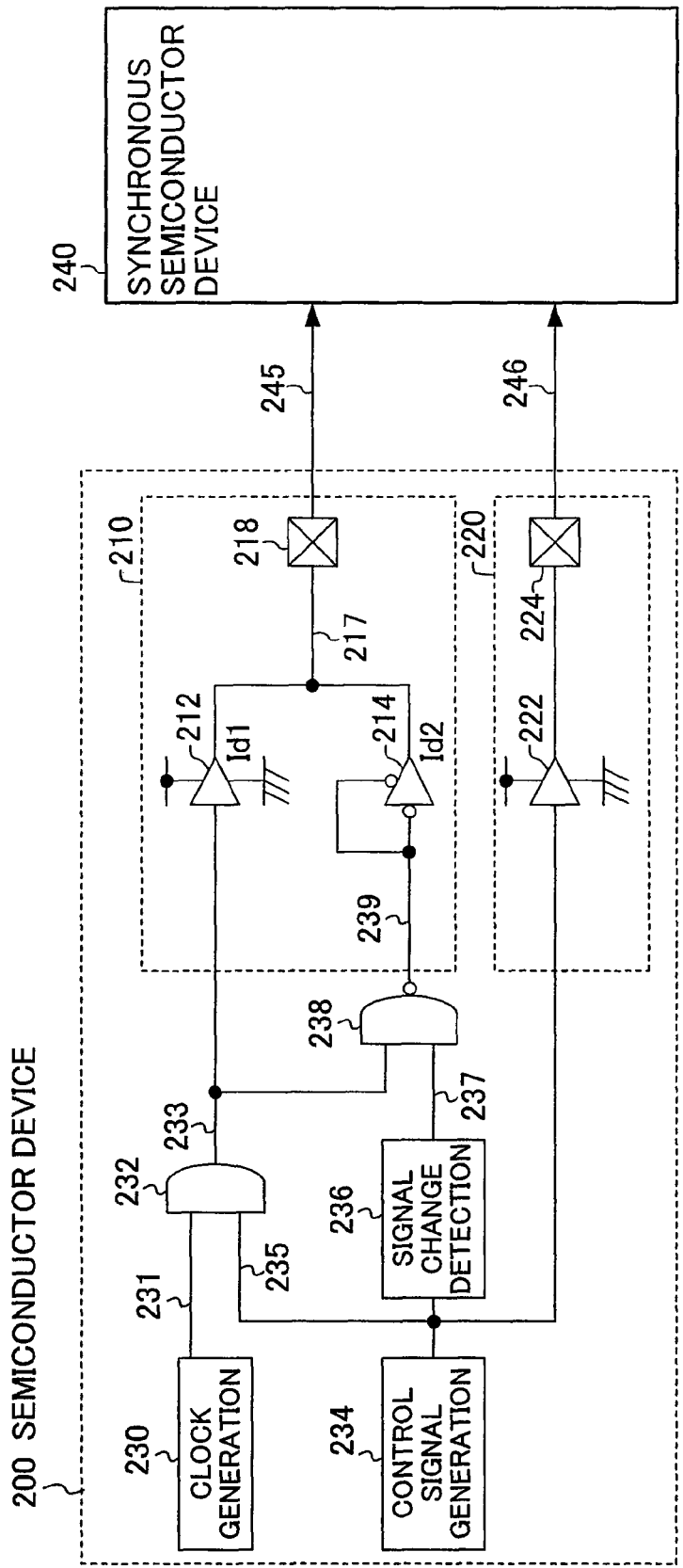
FIG. 8 is a block diagram illustrating a system using a semiconductor input/output control circuit according to a second embodiment of the present invention.

FIG. 8 is a block diagram illustrating a system using a semiconductor input/output control circuit according to a second embodiment of the present invention. As shown in FIG. 8, a semiconductor device 200 of this embodiment supplies an external clock control signal 246 with an external clock signal 245 to a synchronous semiconductor device 240.

The semiconductor device 200 includes: a clock generation circuit 230 for generating a basic clock signal 231; a control signal generation circuit 234 for generating a clock control signal 235; a clock mask circuit 232 for masking the basic clock signal 231 using the clock control signal 235; a signal change detection circuit 236 which has, for example, the same internal configuration as the configuration of FIG. 2 or FIG. 3 and supplies an output adding control signal 237 holding the "H" level for a certain period when the signal change detection circuit 236 detects that the clock control signal 235 is changed from a non-activated (for example, "L") level to an activated (for example, "H") level; an output adding clock mask circuit 238 for further masking a clock signal 233 using the output adding control signal 237; a clock output I/O 210 for receiving the clock signal 233 from the clock mask circuit 232, an adding clock signal 239 from the output adding clock mask circuit 238 and outputting the external clock signal 245; and a clock control signal output I/O 220 for receiving the clock control signal 235 and outputting the external clock control signal 246.

The clock output I/O 210 includes: a clock output buffer 212 for driving an output clock signal 217, based on the clock signal 233 from the clock mask circuit 232; at least one output adding buffer 214 for driving the output clock signal 217, based on the adding clock signal 239 only when the adding clock signal 239 from the output adding clock mask circuit 238 exhibits the "L" level; and an I/O pad 218 for outputting the output clock signal 217 as the external clock signal 245. The output adding buffer 214 is temporarily operated so as to enhance a driving ability of the output clock signal 217 when the signal change detection circuit 236 detects that the logic level of the clock control signal 235 is changed from the "L" level to the "H" level. That is, an output of the output adding buffer 214 having a current ability Id2 is temporarily added to an output of the clock output buffer 212 having a current ability Id1.

The clock control signal output I/O 220 includes a control signal output buffer 222 and an I/O pad 224, which are provided for outputting the external clock control signal 246, based on the clock control signal 235.

Figure 9:
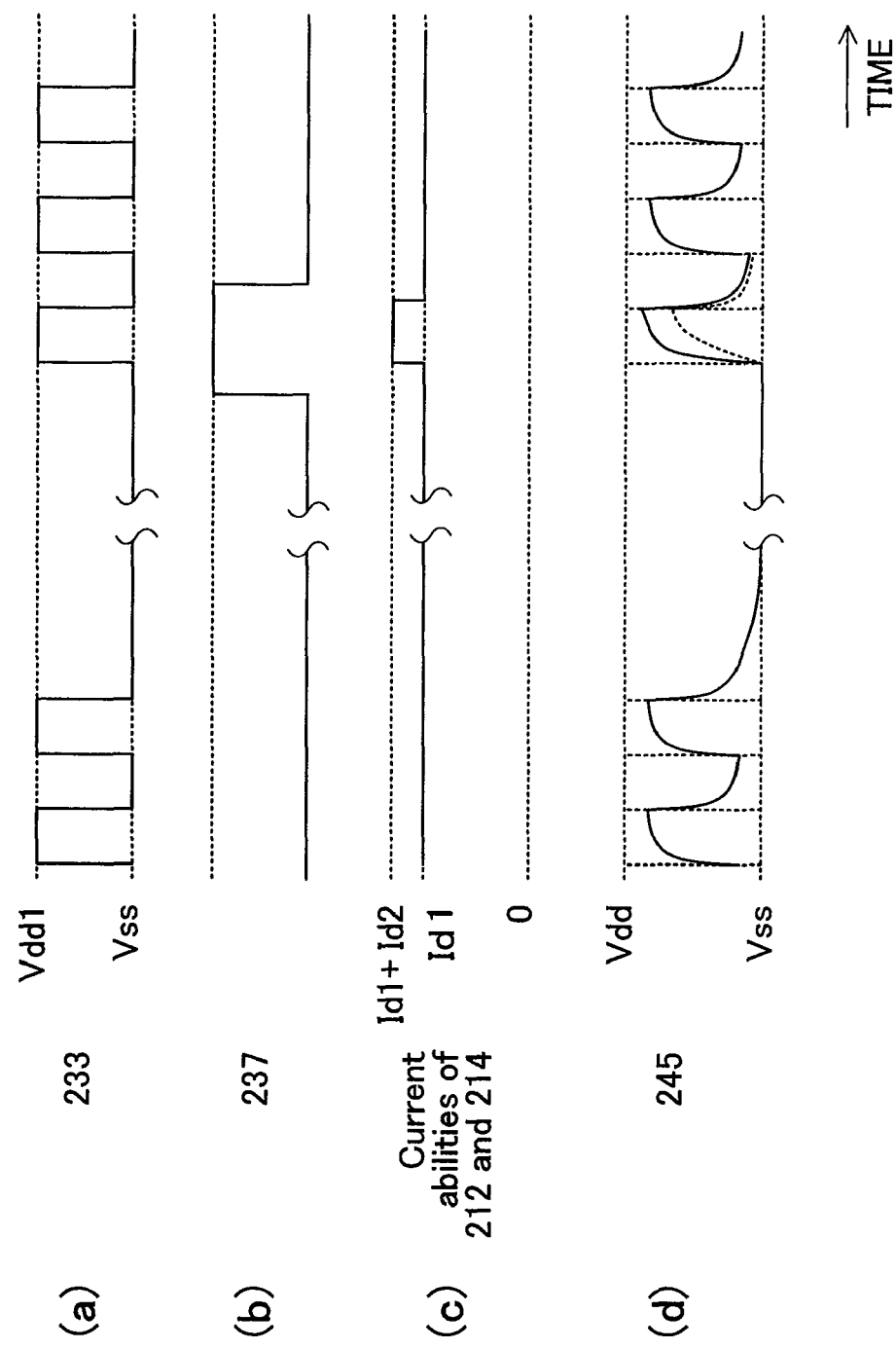
FIGS. 9(a) through 9(d) show examples of signal waveforms in the system of FIG. 8.

FIGS. 9(a) through 9(d) show examples of signal waveforms in the system of FIG. 8. The clock signal 233 to be received by the clock output buffer 212 having the current ability Id1 is intermittently output as shown in FIG. 9(a) and, when the output adding control signal 237 of FIG. 9(b) is generated, a signal of the output adding buffer 214 having the current ability Id2 is added to a signal of the clock output buffer 212 having the current ability of Id1 only in a period in which the output adding control signal 237 is the "H" level, so that the output clock signal 217 is generated by a buffer having a current ability of FIG. 9(c). Thus, the external clock signal 245 is corrected and has a signal waveform of FIG. 9(d).

Third Embodiment

Figure 10:
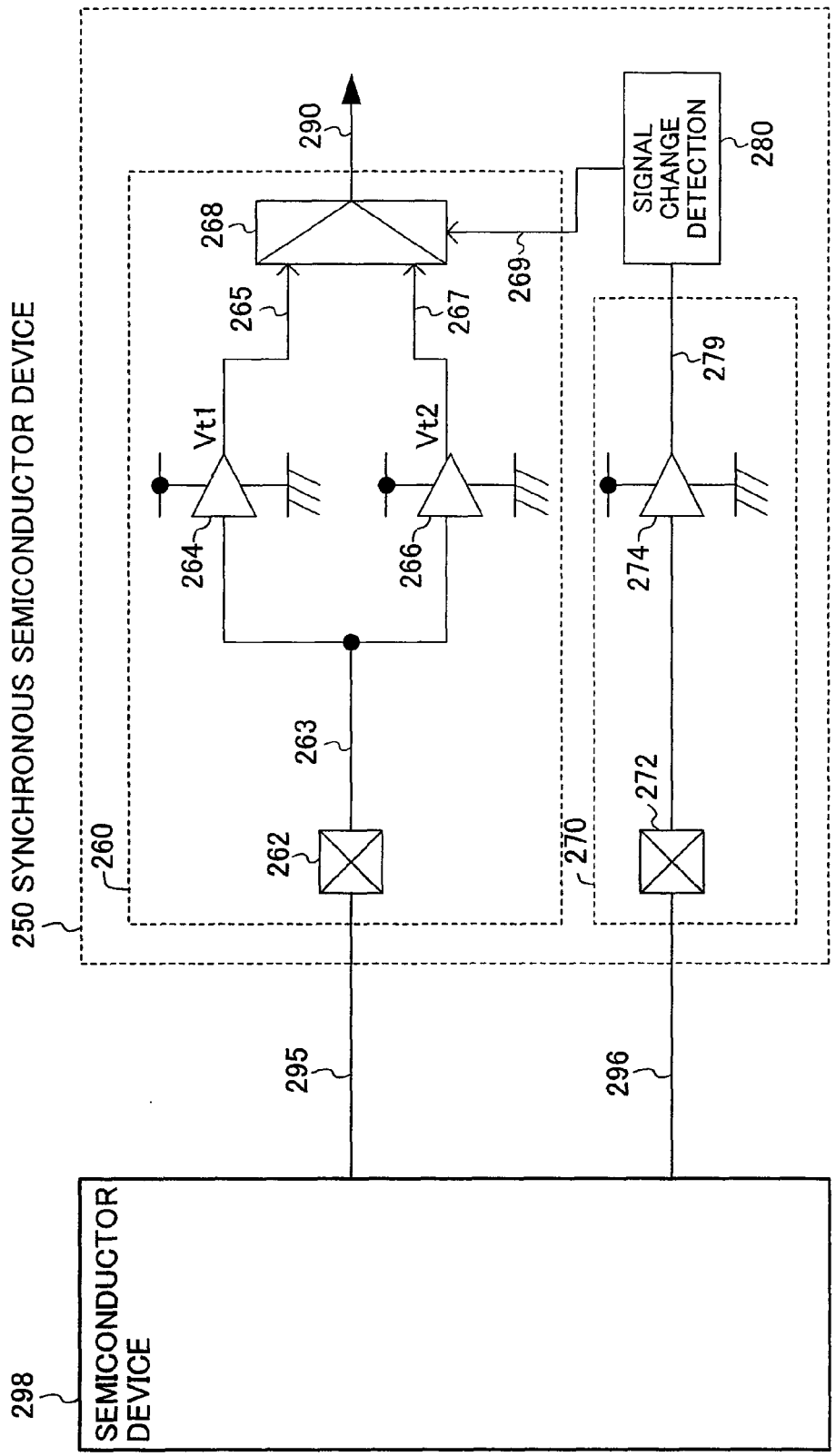
FIG. 10 is a block diagram illustrating a system using a semiconductor input/output control circuit according to a third embodiment of the present invention.

FIG. 10 is a block diagram illustrating a system using a semiconductor input/output control circuit according to a third embodiment of the present invention. As shown in FIG. 10, a synchronous semiconductor device 250 according to this embodiment receives an external clock control signal 296 with an external clock signal 295 from a semiconductor device 298.

The synchronous semiconductor device 250 includes: a clock input I/O 260 for receiving the external clock signal 295 from the semiconductor device 298 and supplying an internal clock signal 290; a clock control signal input I/O 270 for receiving the external clock control signal 296 from the semiconductor device 298 and supplying a clock control signal 279; and a signal change detection circuit 280 which has, for example, the same internal configuration as the configuration of FIG. 2 or FIG. 3 and supplies an input selection signal 269 holding the "H" level for a certain period when the signal change detection circuit 280 detects that a logic level of the clock control signal 279 is changed from a non-activated (for example, "L) level to an activated (for example, "H") level.

The clock input I/O 260 includes: an I/O pad 262 for receiving the external clock signal 295 and supplying the external clock signal 295 as an input clock signal 263; a first input buffer 264 for supplying a first input 265 driven with a first threshold Vt1, based on the input clock signal 263; a second input buffer 266 for supplying a second input 267 driven with a second threshold Vt2 (<Vt1), based on the input clock signal 263; and an input selector 268 for selecting one of the first input 265 of the first input buffer 264 and the second input 267 of the second input buffer 266 as the internal clock signal 290, based on the input selection signal 269 from the signal change detection circuit 280. The signal change detection circuit 280 supplies the input selection signal 269 so that the input selector 268 normally selects the first input 265 and temporarily selects the second input 267 only when the signal change detection circuit 280 detects that the logic level of the clock control signal 279 is changed from the "L" level to the "H" level.

The clock control signal input I/O 270 includes: an I/O pad 272 for receiving the external clock control signal 296; and a control signal input buffer 274 for driving the clock control signal 279, based on the external clock control signal 296.

FIGS. 11(*a*) through 11(*e*) show examples of signal waveforms in the system of FIG. 10. In the external clock signal 295 to be intermittently received, an unstable waveform distortion of FIG. 11(*a*) is generated due to an external load. Accordingly, as shown in FIG. 11(*b*) and FIG. 11(*c*), distorted timing of edge and duty ratio with respect to the original clock signal appear on the first input 265 and the second input 267. However, the input selection signal 269 is turned "H" at the timing shown in FIG. 11(*d*) and thus the first input 265 and the second input 267 are properly switched. As a result, the internal clock signal 290 has a corrected waveform of FIG. 11(*e*).

INDUSTRIAL APPLICABILITY

As has been described, a semiconductor input/output control circuit according to the present invention includes a waveform correction means for correcting an intermittent clock signal to be exchanged between semiconductor devices and is useful as a power consumption reduction technique for a high-speed synchronous memory or the like.

The invention claimed is:

1. A semiconductor input/output control circuit which is an input/output control circuit provided in a semiconductor device and having a function of supplying, to a synchronous semiconductor device for performing a synchronous operation with an external clock signal, an external clock control signal indicating whether or not the external clock signal is being supplied, the semiconductor input/output control circuit comprising:

a clock generation circuit for generating a basic clock signal;

a control signal generation circuit for generating a clock control signal having a first logic level indicating that supply of the external clock signal is stopped and a second logic level indicating that the external clock signal is being supplied;

control signal output means for outputting the external clock control signal, based on the clock control signal;

a clock mask circuit for masking the basic clock signal using the clock control signal;

a signal change detection circuit for detecting that a logic level of the clock control signal is changed from the first logic level to the second logic level; and clock output means for outputting the external clock signal, based on the masked clock signal which is an output from the clock mask circuit, and temporarily correcting, when the signal change detection circuit detects that the logic level of the clock control signal is changed from the first logic level to the second logic level, a waveform of the masked clock signal to output the external clock signal.

2. The semiconductor input/output control circuit of claim 1, wherein the clock output means includes:

a first output buffer for supplying a first output driven with a first reference voltage, based on the masked clock signal;

a second output buffer for supplying a second output driven with a second reference voltage which is higher than the first reference voltage, based on the masked clock signal; and an output selector for normally selecting the first output as the external clock signal and temporarily selecting, when the signal change detection circuit detects that the logic level of the clock control signal is changed from the first logic level to the second logic level, the second output as the external clock signal.

3. The semiconductor input/output control circuit of claim 1, wherein the signal change detection circuit has a function of outputting a pulsed adding signal when the signal change detection circuit detects that the logic level of the clock control signal is changed from the first logic level to the second logic level, and the clock output means includes:

a signal adding circuit for adding the pulsed adding signal to the masked clock signal; and a clock output buffer for driving the external clock signal, based on an output of the signal adding circuit.

4. The semiconductor input/output control circuit of claim 1, further comprising:

a clock output buffer for driving the external clock signal, based on the masked clock signal; and at least one output adding buffer for temporarily performing an operation so as to enhance a driving ability of the external clock signal when the signal change detection circuit detects that the logic level of the clock control signal is changed from the first logic level to the second logic level.

5. The semiconductor input/output control circuit of claim 1, wherein the signal change detection circuit is a synchronous circuit including at least one flipflop and a logic operational circuit.

6. The semiconductor input/output control circuit of claim 1, wherein the signal change detection circuit is a non-synchronous and non-linear circuit using at least one capacitance element.

7. A semiconductor input/output control circuit which is an input/output control circuit provided in a synchronous semiconductor device and has a function of receiving with an external clock signal from another semiconductor device an external clock control signal indicating whether or not the external clock signal is being supplied and performing a synchronous operation with the external clock signal, the semiconductor input/output control circuit comprising:

a control signal input buffer for receiving the external clock control signal and supplying a clock control signal according to the external clock control signal;

a signal change detection circuit for detecting that a logic level of the clock control signal is changed from a first logic level indicating that supply of the external clock signal is stopped to a second logic level indicating that the external clock signal is being supplied; and a clock input means for receiving the external clock signal and supplying an internal clock signal according to the external clock signal, and temporarily correcting, when the signal change detection circuit detects that the logic level of the clock control signal is changed from the first logic level to the second logic level, a waveform of the external clock signal to supply the internal clock signal.

8. The semiconductor input/output control circuit of claim 7, wherein the signal change detection circuit has a function of outputting a pulsed adding signal when the signal change detection circuit detects that the logic level of the clock control signal is changed from the first logic level to the second logic level, and the clock input means includes:

a signal adding circuit for adding the pulsed adding signal to the external clock signal; and a clock input buffer for driving the internal clock signal, based on an output of the signal adding circuit.

9. The semiconductor input/output control circuit of claim 7, wherein the clock input means includes:

a first input buffer for supplying a first input driven with a first threshold, based on the external clock signal;

a second input buffer for supplying a second input driven with a second threshold which is lower than the first threshold, based on the external clock signal; and an input selector for normally selecting the first input as the internal clock signal and temporarily selecting, when the signal change detection circuit detects that the logic level of the clock control signal is changed from the first logic level to the second logic level, the second input as the internal clock signal.

10. The semiconductor input/output control circuit of claim 7, wherein the signal change detection circuit is a synchronous circuit including at least one flipflop and a logic operational circuit.

11. The semiconductor input/output control circuit of claim 7, wherein the signal change detection circuit is a non-synchronous and non-linear circuit using at least one capacitance element.

* * * * *